United States Patent
Noworolski et al.

[11] Patent Number: 5,546,003
[45] Date of Patent: Aug. 13, 1996

[54] MULTI-CELL BATTERY MONITORING SYSTEM WITH SINGLE SENSOR WIRE

[75] Inventors: Zbigniew Noworolski, North York; Vlad Sterescu, Brampton; Albert Lee; Padraig Halton, both of Etobicoke, all of Canada; Jan M. Noworolski, Berkeley, Calif.

[73] Assignee: Polytronics Engineering Ltd., Markham, Canada

[21] Appl. No.: 206,678

[22] Filed: Mar. 7, 1994

[51] Int. Cl.$^6$ ................................................. G01N 27/416
[52] U.S. Cl. ............................................. 324/434; 320/48
[58] Field of Search .................................. 324/434, 433, 324/429; 340/636; 320/48

[56] References Cited

U.S. PATENT DOCUMENTS

| | | | |
|---|---|---|---|
| 2,675,522 | 4/1954 | Godshalk | 324/434 |
| 3,515,983 | 6/1970 | Lante | 324/434 |
| 4,424,491 | 1/1984 | Bobbet et al. | 324/434 |
| 4,484,140 | 11/1984 | Dien | 324/434 |
| 4,931,738 | 6/1990 | MacIntyre et al. | 324/434 |
| 5,099,211 | 3/1992 | Nowak | 324/434 |

*Primary Examiner*—Maura K. Regan
*Attorney, Agent, or Firm*—Neil H. Hughes; Ivor M. Hughes; Marcelo K. Sarkis

[57] ABSTRACT

A method for detecting the condition of the individual cells of a bank of serially connected battery cells is provided. The method utilizes a single common sensing wire connected through respective non-linear component switching mechanisms to respective reference terminals. The reference terminals are located between adjacent batteries and at the end of the battery assembly. The method includes the step of detecting an instantaneous change of impedance at points of transition of the state of the individual switches provided.

17 Claims, 4 Drawing Sheets

5,546,003

MULTI-CELL BATTERY MONITORING SYSTEM WITH SINGLE SENSOR WIRE

FIELD OF INVENTION

The present invention relates to a muti-cell monitoring system for detecting the condition of individual cells within a serially connected bank of batteries.

BACKGROUND OF THE INVENTION

It is known that the condition of a bank of serially connected battery cells is dependent upon the condition of the individual cells within the bank. In order to detect a deteriorating one of the cells the condition of a given cell must be measured individually or as part of a plurality of different groups of cells. In particular, to monitor battery voltages, it has been common to use a differential multiplex method in which flying capacitors or high voltage multiplexes are used to collect voltage from different cells. In either case, at least one wire per measured cell has been used to provide a sensing voltage for the multiplexing circuitry. The disadvantage of such a system lies mainly in the number of sensing wires.

U.S. Pat. No. 5,099,211 permits measurements of multi-cell arrangements with a single sensing wire. According to this patent one lead of a single voltage response switch is connected to each of the interconnecting battery terminals and a common terminal. In addition, the switch is connected between this common terminal and one of the end terminals of the bank of batteries. A ramp voltage is then applied between the other end terminal and the common terminal, the ramp voltage being such as to extend from zero to a voltage in excess of the total voltage of the bank of batteries. As the voltage is ramped up each switch is opened then closed, in succession. This arrangement gives rise to current pulses and both ramp voltage and instantaneous current through this arrangement are coordinately provided as output. The voltage between discrete pairs of pulses are an indication of the cell voltage.

A serious drawback of the invention disclosed in U.S. Pat. No. 5,099,211 is that it is difficult to accurately measure voltages below a few volts due to the nature of the switching. The method is also noise sensitive and might have problems in proper operation in the presence of a ripple voltage. Furthermore, it employs a rather complicated switching circuit which has to be built into every battery sensing wire connector.

It is an object of the present invention to provide a multi-cell battery monitoring system, method and apparatus utilizing a single sensing wire which is capable of accurately measuring voltage, including voltages below one volts, in a manner which is resistant to noise and the effects of a ripple voltage.

Further and other objects of this invention will become apparent to a man skilled in the art when considering the following summary of the invention and the more detailed description of the preferred embodiments illustrated herein.

SUMMARY OF THE INVENTION

According to one aspect of the invention there is provided an apparatus for monitoring the condition of individual cells within a serially connected multicell battery system comprising:

a battery assembly including a plurality of batteries connected in series;

a plurality of reference terminals including first and second reference terminals located at the beginning and end of the batteries assembly, respectively, and a plurality of intermediate reference terminals each interconnecting a plus (+) terminal of a respective one of said batterys to the negative (−) terminal of an adjacent one of said batterys;

a common sensing lead;

a plurality of voltage and/or current responsive non-linear component switching means, each intermediate terminal and the second reference terminal being connected to said common sensing lead through a respective one of said non-linear component switching means, the non-linear component switching means, cooperatively adapted to serially effect a change in the state of each of the respective non-linear component switching means in response to a predetermined voltage/current present at said common sensing wire;

voltage/current generating means for supply to said common sensing wire a predetermined voltage/current;

means for detecting a change in impedance of said common sensing wire;

means for instantaneously measuring the voltage and/or current and/or impedance of said common sensing wire upon detection of said rapid change of impedance.

means for providing output indicating the condition of at least a deteriorating one of said individual batteries based on the instantaneous voltages and/or currents and/or impedances measured. Preferably said non-linear component switching means sensors are a capacitor and a series connection of a diode and a resistor. In one embodiment said voltage/current generating means is capable of injecting into said common sensing wire a continuous series of incrementally increasing voltages/currents of predetermined range of magnitude and polarity. In another embodiment said voltage/current generating means is a RC network connected to a discharge switch. Preferably said non-linear component switching means further comprises:

a MOSFET connected in series with the diode and resistor, the MOSFET located proximal to the common sensing wire for receiving a voltage/current impulse from the voltage/current generating means; and a capacitor connected in parallel between the MOSFET gate an source and resistor for receiving a charge through an internal diode of the MOSFET and supplying a voltage to the gate of the MOSFET;

the components of the non-linear component switching means cooperating to allow serial conduction through a single MOSFET at a time beginning with the MOSFET located to the second reference terminal. In another embodiment said non-linear component switching means further comprises a second diode operatively connected to the MOSFET for limiting the voltage applied to the gate. Preferably said second diode is a Zener diode. In another embodiment said non-linear component switching means further comprises a speed up diode placed across the resistor to assist in charging the capacitor. Preferably said output is in human readable form. In another embodiment said output includes a voltage reading of each of the individual batteries.

According to yet another aspect of the invention there is provided a method for detecting the condition of the individual cells of a bank of serially connected battery cells using a single common sensing wire connected through respective non-linear component switching means to respective reference terminals located between adjacent batteries and at the end of the battery assembly, which method comprises:

injecting into the common sensing wire a voltage or current of magnitude, polarity and duration sufficient to serially alter the common state of the respective switching means;

detecting an instantaneous rapid change of impedance at points of transition of the sate of the individual switches;

determining the voltage and/or current of the common sensing wire at the points of rapid change of impedance; and providing output indicating the condition of at least a deteriorating one of said individual batteries based on the voltage and/or current determined at the points of rapid change of impedance. In one embodiment the voltage or current injected into the common sensing wire includes a small AC ripple at a frequency greater than the frequency of the serial transition of said switches and the change in impedance, for example the point of opening of said switches, being monitored by synchronous detection of the non-injected parameter with double frequency to detect even harmonics of injected frequency. Preferably the detection of instantaneous change in impedance of the common sensing wire is accomplished by including the impedance in the resonant circuit of an oscillator and detecting the change in the free-running oscillation frequency of the circuit attributable to changes in the impedance. In another embodiment the instantaneous rapid change in impedance is detected by monitoring the changes in voltage and current in the common sensing wire during the period over which the respective switches are opened, plotting the change in voltage relative to change current for that period and comparing the plot against a reference plot.

According to yet another aspect of the invention there is provided a in combination:

a pair of first and second terminals;

a battery assembly connected between said terminals comprising a plurality of serially arranged batteries having a pair of plus and minus battery terminals;

a plurality of intermediate terminals each interconnecting a plus terminal of one said batteries to the negative terminal of an adjacent said batteries a common electrical lead;

voltage generating means;

a plurality of the voltage responsive switching means each connected between said common electrical lead and a discrete battery terminal and each responsive to a voltage difference between a discrete battery terminal and said sensing wire, said voltage responsive switching means cooperating to permit measurement of the respective voltage of one or more battery terminals through a single series of sequential changes in the individual states of respective switching means, wherein the respective switching means change from a common state individually, once in succession, until each respective switching is in the opposite common state; and a voltage sensing for means detecting the potential between said common sensing wire and said first terminal;

means for providing an output responsive to the said potential detected by said common sensing wire.

According to yet another aspect of the invention there is provided a in combination:

a pair of first and second terminals;

a battery assembly connected between said terminals comprising a plurality of serially arranged batteries having a pair of plus and minus battery terminals;

a plurality of intermediate terminals each interconnecting a plus terminal of one said battery module to the negative terminal of an adjacent said battery module;

a common electrical lead;

charging pulse generating means for generating a DC charge pulse from approximately zero to a voltage slightly exceeding a voltage of said serially arranged plurality of battery modules, said charge voltage being connected between said first terminal and said common electrical lead and wherein said battery voltages at said second terminal with respect to said first terminal and said ramp voltage at said common lead with respect to said first terminal are of like polarity;

a plurality of the switching means, each connected between said common electrical lead and a discrete battery terminal for effecting a closed circuit during said charge pulse and some time after removal of the said charge pulse whereby said switching means are all closed during said charge pulse but open discretely and separately as a function of time;

a voltage sensing means of the said common electrical lead and indicating means responsive to said voltage sensing means. In one embodiment said switching means comprises:

voltage between said common electrical lead and said terminal for providing a first closing responsive to a potential between said common electrical lead and open in response to the last said potential and the time constant of the control input.

In another embodiment said switching means is a field effect transistor and diode, the drain and source leads of which are connected in series with said diode between said common lead and on of said terminals, and the resistor connected between GATE and the last said terminal. Preferably said resistor and the total capacitance between GATE and DRAIN of the said field effect transistor form the said time constant of the said control input.

BRIEF DESCRIPTION OF THE DRAWINGS

Further object and advantages of the invention will be apparent from the ensuing detailed description of preferred embodiments of the invention and the accompanying drawings, of which:

FIG. 3a is a block diagram of a further preferred embodiment of the invention.

FIG. 3b is a block diagram of a further preferred embodiment of the invention.

FIG. 3c is a block diagram of a further preferred embodiment of the invention.

FIG. 3d is a block diagram of further preferred embodiment of the invention.

DETAILED DESCRIPTION OF PREFERRED EMBODIMENTS OF THE INVENTION

Figure 1:
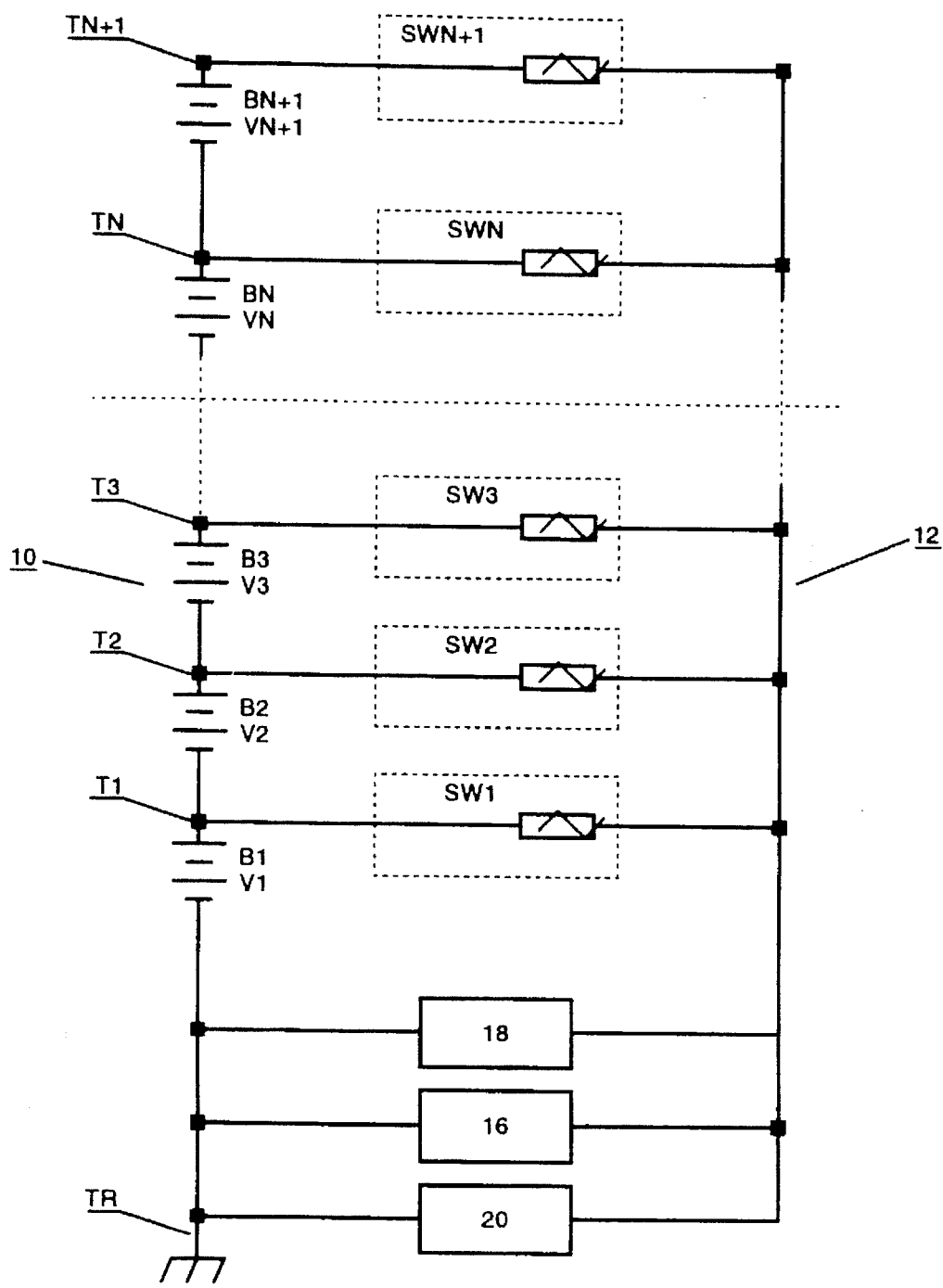
FIG. 1 is a schematic representation of the invention showing a circuit capable of measuring individual cell voltages within the multi-cell battery monitoring system.

Referring first to FIG. 1, a battery assembly 10 is shown comprising a series of battery modules B1 through $B^{N+1}$ connected in series. It is to be understood that the terms "battery assembly" and "battery module" are used throughout the specification to refer to a series of battery cells, or to one or more interconnected including holders, battery hold, battery receptacles, housing or clips etc., adapted to house a plurality of individual battery cells in series. A common sensing wire 12 is shown connected to a series of reference terminals $T^1–T^{N+1}$ including end reference terminal N+1 through respective switching means $SW^1$ to $SW^{N+1}$ associated with respective battery module $B^1$ through $B^{N+1}$. The respective non-linear component switching means $SW^1$ to $SW^{N+1}$ are adapted to serially open the switching means between the sensing wire and successive reference terminals in response to injections of voltage or current in the form of pulses or continuous outputs, including voltages/currents of successively increasing magnitude supplied by a voltage/current generating means 16, for example, a voltage/current step generator. The common sensing wire is connected to means for detecting a rapid change in impedance 18 which may be embodied in a variety of forms, as discussed below. The invention also includes means 20 for instantaneously measuring voltage and or current in response to a rapid change of impedance and, combined therewith or separately therefrom, means to provide output indicating the condition of at least a deteriorating one of said individual batteries cells based on the instantaneous voltages and/or currents and/or impedance measured, preferably by displaying the output in human or computer readable form.

Figure 2:
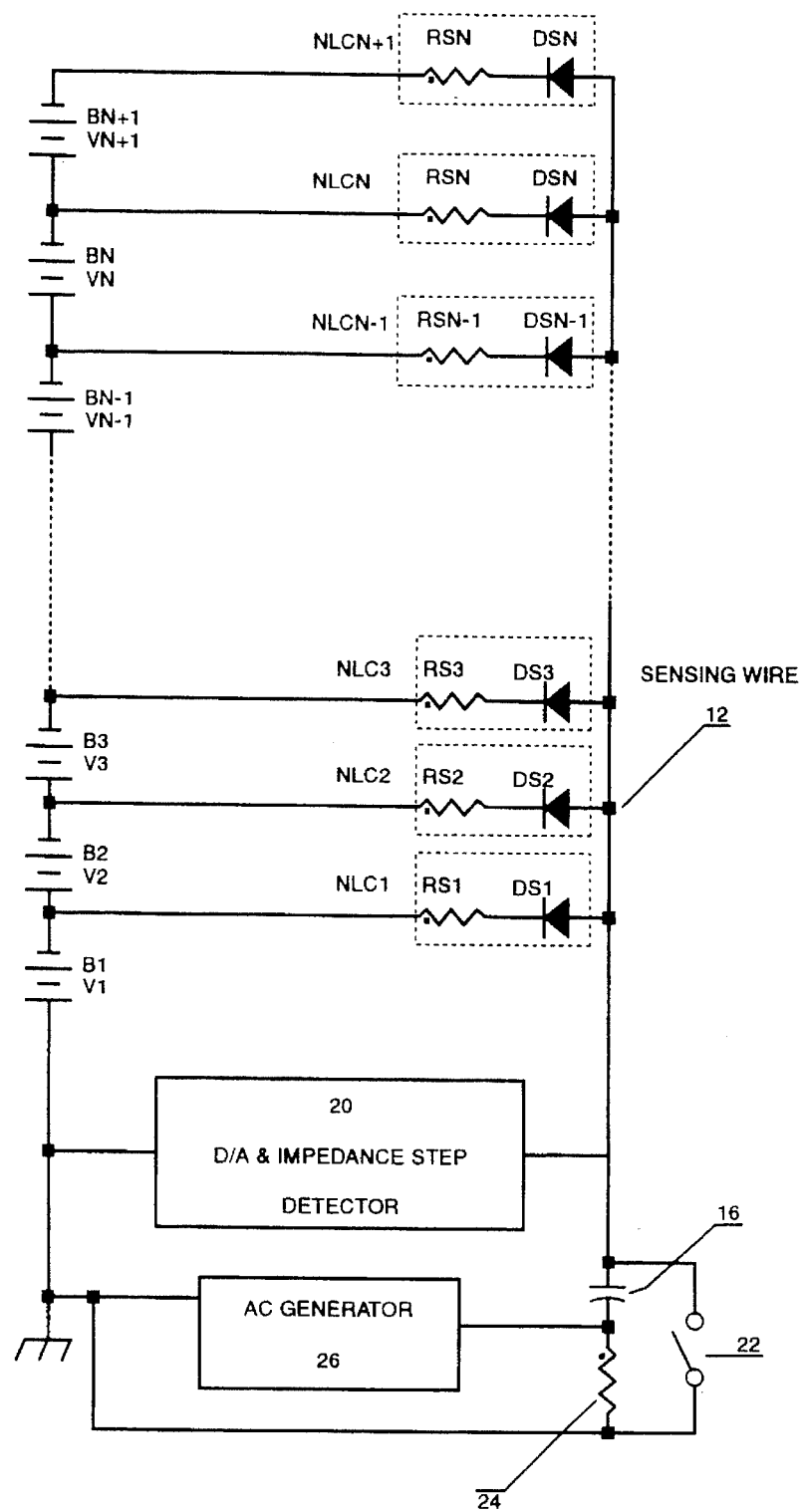
FIG. 2 is a block diagram of the first preferred embodiment of the invention.

The apparatus and method of the invention will now be explained with reference to FIG. 2 showing a preferred embodiment of the invention in which each non-linear component switching means $NLC^1$ to $NLC^{N+1}$ comprises a resistor and diode. The respective resistors and diodes are identified in FIG. 2 as $RS^1$ through $RS^N$ and $DS^1$ to $DS^N$, respectively. In operation, when voltage supplied by the capacitor 16 approaches the voltage equal to $V^1$ the diode $DS^1$ will stop conducting and the impedance of common sensing wire 12 will rapidly change. Voltage and current of the common sensing wire 12 is then measured. The first measured voltage $V^1$ and/or current of the sensing wire is then stored for further calculation. Subsequently, through further charging of the capacitor the voltage of the common sensing wire 12 incrementally rises again and the next sudden change in the impedance occurs since the diodes $DS^2$ has stopped conducting. The voltage V1+V2 can be measured at that moment and a simple algorithm permits V1 and V2 to be calculated. This process is repeated until the last step of the impedance change is detected. Then the voltage injected into the common wire is reset again to zero using discharge switch 22 by discharging the capacitor 16 through resistor 24. Voltage and/or current measurements are made by means adapted for instantaneously measuring voltage and/or current 20 in response to detection of a rapid change of impedance, preferably in the form of a microprocessor which preferably combines a means for evaluating the condition of individual battery cells based on the measured instantaneous voltage and/or currents and/or impedance and a means to provide output indicating the condition of at least a deteriorating one of said individual batteries cells.

Any method of detecting a rapid change in impedance can be employed to carry out the invention. According to one preferred embodiment a small AC ripple of a much higher frequency than the process repetition is injected into the sensing wire, from the AC generator 26 either in the form of voltage or current. The response is monitored by measuring the instantaneous value of the non-injected parameter (voltage when current is injected or current when voltage is injected). Synchronous detection of that parameter with double frequency allows the detection of any even harmonics of injected frequency.

These even harmonics will be generated during the transition period, ie. when the diode is about to stop conducting. Hence, detecting the presence of even harmonics will define the point at which the voltage of the sensing wire is equal to or at least very close to the battery voltage to which the diode being turned off is connected.

Another preferred method of detection of the transition period is to include the impedance of the sensing wire into the resonance circuit of an oscillator and detecting the change in the free-running oscillation frequency of the circuit attributable to changes in the impedance. In this case a combination of diode, capacitor and resistor might be used as the non-linear component switching means. As long as the number of conducting diodes does not change, the frequency of the circuitry doesn't change either. When the transition occurs (diode will stop to conduct), the change in the frequency will follow and can be easily detected. Similarly, phase detection of the current versus voltage in the forced frequency generation can be used.

Another preferred method of detecting a change in impedance is to determine which diodes are conducting by comparing the plot of the voltage versus the current of the common sensing wire to the reference plot stored in the microprocessor. By mathematically subtracting those two plots, it is possible to determine where the sudden change of impedance occurred and to calculate the voltage at that point. It is understood that the term "plot" or "plotting" is used throughout the specification to refer broadly to any algorithm which can be used to model the plotting of graphs to calculate the point of sudden change of impedance.

It is noteworthy that the voltage drop across the diode is irrelevant. It simply will shift the measured point up by that voltage drop. It is important that all diodes used in shown in FIG. 2 be identical. The most obvious choice for low voltage systems are Schotky diodes and for higher voltage systems, ordinary diodes.

Figure 3:
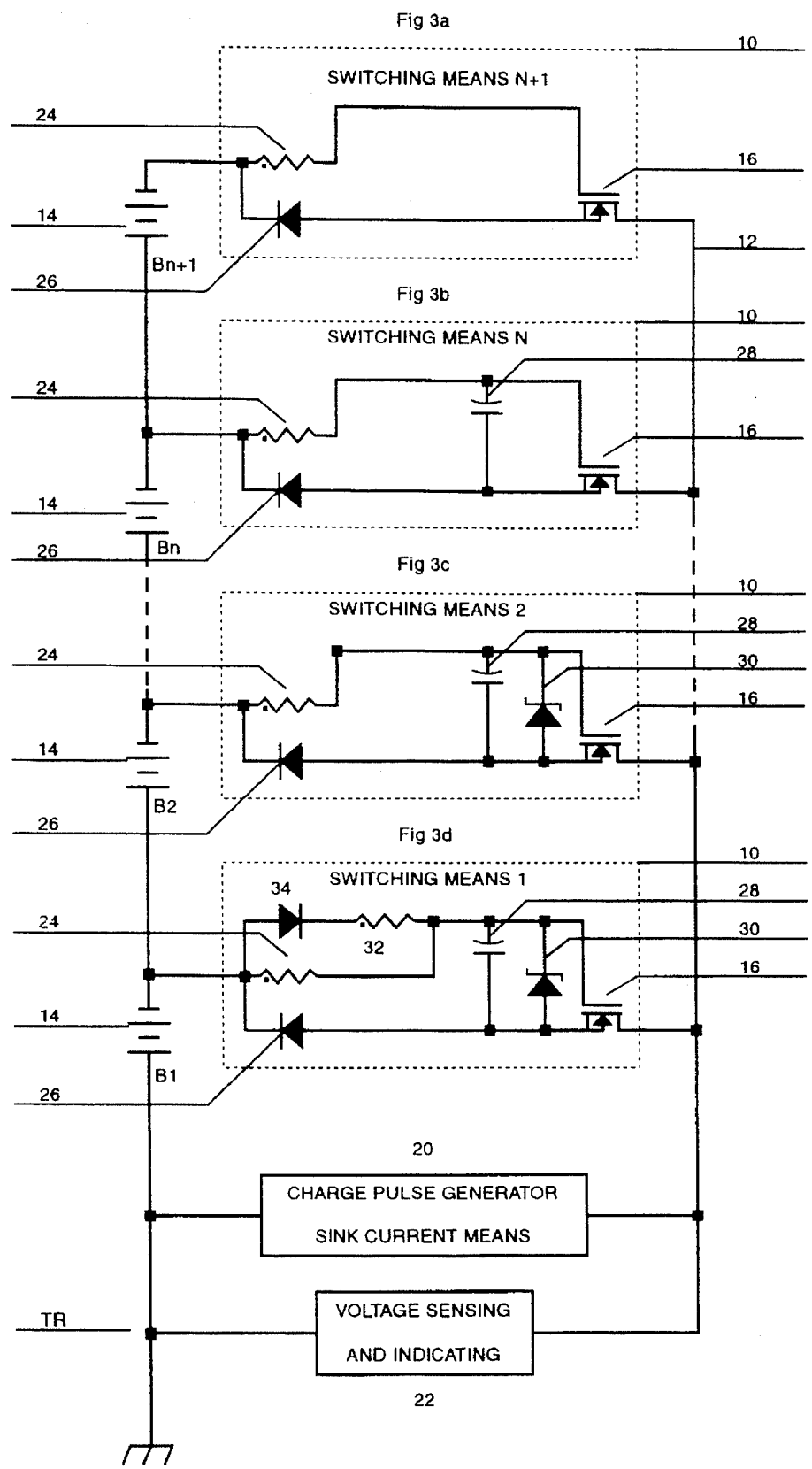
FIG. 3 is a composite of FIGS. 3a–3d.
Figure 4:
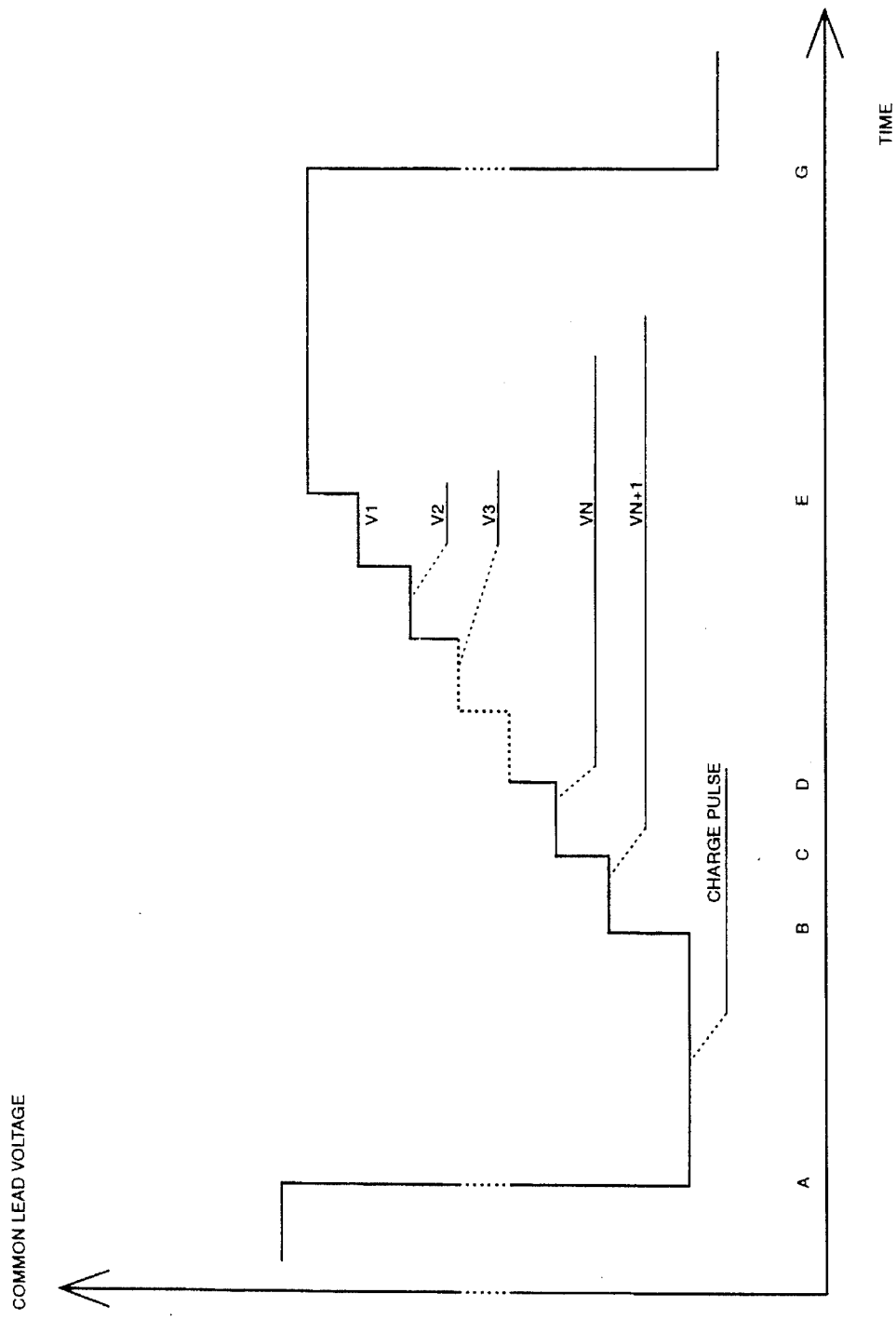
FIG. 4 is a graph of the voltage of the common sensing wire over time in the preferred embodiment described in FIG. 3A to 3d.

Described below with reference to FIGS. 3 and 4 is yet another method apparatus for carrying out the invention using field effect transistors, diodes and capacitor networks in conjunction with the common sensing wire.

Multiple switching means 10 are connected between the sensing wire 12 the respective battery modules 14 as shown in FIG. 3a–3d. It is understood that switching means as illustrated in FIG. 3a–3d can be identified. Multiple of any type of the switching means illustrated in FIG. 3a, 3b, 3c, and 3d may be used. The switching means 10 each comprises a transistor 16 which is shown in the preferred embodiments of FIGS. 3a–3d as an N channel MOSFET. Each switching means 10, also includes a resister 24 and a diode 26. The diode 26 is connected between the source of the transistor 16 and the end of resistor 24 proximal to the respective battery modules 14. The other end of the resistor 24 is connected to the gate of the transistor 16.

The terminal TO of the battery string is shown in common with a voltage supply means preferably in the form of means of applying a charge pulse 20, and voltage sensing and output means 22. However it is understood that either component maybe located at any point in the overall circuit as long as it is connected between the sensing wire 12 and a battery module terminal. It is also understood that the voltage sensing and output means 22 may comprise separate sensing and output means. Also, the means of applying the charge pulse 20 is understood to comprise a means of applying a sink or source current.

In an preferred embodiment of the invention the charge pulse has a negative polarity and its amplitude is higher than the most negative end of the battery string. However, if P Mos channel transistors are used, the polarity of all diodes and battery modules and voltages should be reversed. It is also possible to use J-FETS as a transistor 16. The following description is true for N-channel MOSFETS BUT APPLIES MUTATATIS mutandisTO P-channel MOSFETS.

Initially, the potential of the sensing wire 12 is raised up by the means of applying a charge pulse 20 to a level higher that the total voltage of the battery string. As a result, all internal diodes of the transistor 16 in each switching means 10 will conduct and provide a charging path for the internal capacitor ie. GATE-SOURCE of the transistor 16 via resistor 24. As long as the charging pulse is maintained, all GATE-SOURCE internal capacitors of all transistors 16 will remain charged. Polarity of this charge is such, that when the charge pulse is removed, the remaining charge across the GATE-SOURCE of the internal capacitors of each transistor 16 will maintain the transistors 16 in the conducting state. As a result of that the sensing wire potential will be maintained at the level of the total string voltage as long as voltage between the gate and source of transistor 16 in the switching means 10 most remote from terminal TO is sufficient to keep this transistor 16 in the conducting state.

The fact that the other transistors 16 in all remaining switching means are conducting is irrelevant because all remain diodes 26 will be polarized in non-conductive direction.

With the charge pulse absent, the internal GATE-SOURCE capacitor of the transistor of the switching means N+1 will start to discharge until it reaches a point when this transistor will stop conducting. Only switching means N+1 will be open because as long as it is conducting, the internal capacitor of the GATE-SOURCE of the remaining switching means 10 will be maintained in charge condition. As soon as switching means N+1 ceases to conduct, the adjacent switch means N will start to conduct and will present to the sensing wire 12 a voltage equal to the total battery string voltage less one battery module (BN+1). The process will repeat itself with each respective switching means 10 subsequently ceasing to conduct at successive intervals.

In a preferred embodiment of the invention an external capacitor 28 may be added to increase the discharge time as shown in FIG. 3B.

In a further preferred embodiment of the invention, when the battery string voltage is higher than the permitted voltage across the gate and source of the transistor 16, a Zener diode 30 can be added to the circuit shown in FIG. 3a or 3b between the gate and source of this transistor for protection purposes preferably in the manner shown in FIG. 3C.

As shown in FIG. 3d, an additional resistor 32 and diode 34 can be added to the circuit shown in FIG. 3a [or 3(b), or 3(c)-not shown]across resistor 24 in order to enhance charging time. As shown in FIG. 4 the sensing wire voltage will descend in a staircase pattern with the time of each step determined by value of total capacitance across GATE SOURCE of each transistor 16 and the discharge resistor 24. If all switching means 10 are identical the duration of each potential step will be approximately the same. It is possible however to enhance the duration of the potential steps by changing the product of R1 and the total capacitance between the GATE-SOURCE of each switching means 10, as given by the formula $T = R \times C$.

Voltage sensing and output means 22 will preferably respond to each discrete step of the voltage, with individual cell voltages being the difference between each step, thereby providing accurate measurement of each cell in the battery string.

DESCRIPTION OF FIG. 4

FIG. 4 represents a graph of the sensing wire voltages in the circuit when N channel MOSFET transistors are used.

This drawing represents the voltage of the common sensing wire 12 with respect to the battery (any point of the battery string). Y-axis represents voltage and X-axis represents time.

At the time A a charge pulse is applied of amplitude bigger than the total voltage of the battery $V_n$. Polarity of this pulse depends of the type of the transistors used in the switching means and polarity of the battery. FIG. 4 shows the case when negative pulse is applied for the duration required to charge all gate source capacitors of each switching means.

When this pulse is removed at the time B, total voltage of the sensing wire collapses to a level equal to approximately $V_n+1$. At that moment, the gate source capacitor of the switching means 10 connected between Bn and sensing wire 12 will start to discharge. Some time after, at the moment C, this capacitor will discharge to such a level that switching means can not conduct anymore.

As result of this, voltage of the common sensing wire 12 will drop further to the level D which is the total voltage of all battery cells from $V_1$ to $V_n-1$. The difference of the voltages measured at the point C&D represents absolute value of the voltage of the cell $V_n$.

The process then repeats itself until point E at which time the voltage of the sensing wire 12 will reach zero and all gate source capacitors of all switching means will be discharged.

At point G, the charge pulse is again applied in preparation of the circuit to repeat the process again.

As many changes can be made to the invention without departing from the scope of the invention, it is intended that all material contained herein by interpreted as illustrative of the invention and not in a limiting sense.

The embodiments of the invention in which an exclusive property or privilege is claimed are as follows:

1. An apparatus for monitoring the condition of individual cells with within a serially connected multicell battery system comprising:
    a battery assembly including a plurality of batteries connected in series;
    a plurality of reference terminals including first and second reference terminals located at the beginning and end of the batteries assembly, respectively, and a plurality of intermediate reference terminals each interconnecting a plus (+) terminal of a respective one of said batteries to the negative (−) terminal of an adjacent one of said batteries;

a common sensing lead;

a plurality of voltage and/or current responsive non-linear component switching means, comprised of at most one active semiconductor device in conjunction with one or more passive elements each intermediate terminal and the second reference terminal being connected to said common sensing lead through a respective one of said non-linear component switching means, the non-linear component switching means cooperatively constructed to serially effect a change in the state once only of each of the respective non-linear component switching means in response to a predetermined voltage/current supplied to said common sensing wire;

voltage/current generating means for supply to said common sensing wire a predetermined voltage/current;

means for detecting a rapid change in impedance of said common sensing wire;

means for instantaneously measuring the voltage and/or current and/or impedance of said common sensing wire upon detection of said rapid change of impedance;

means for providing output indicating the condition of at least a deteriorating one of said individual batteries based on the instantaneous voltages and/or currents and/or impedances measured.

2. An apparatus as claimed in claim 1, wherein said non-linear component switching means is comprised of a series connection of a diode and a resistor.

3. An apparatus as claimed in claim 1, wherein said voltage/current generating means is capable of injecting into said common sensing wire a continuous series of incrementally increasing voltages/currents of predetermined range of magnitude and polarity.

4. An apparatus as claimed in claim 1, wherein said non-linear component switching means further comprises:

a MOSFET connected in series with the diode and resistor, the MOSFET located proximal to the common sensing wire for receiving a voltage/current impulse from the voltage/current generating means; and a capacitor connected in parallel between the GATE-SOURCE terminals of the MOSFET and for receiving a charge through an internal diode of the MOSFET and supplying a voltage to the gate of the MOSFET;

the components of the non-linear component switching means cooperating to allow serial conduction through a single MOSFET at a time beginning with the MOSFET located to the second reference terminal.

5. An apparatus as claimed in claim 4, wherein said non-linear component switching means further comprises a second diode operatively connected to the MOSFET for limiting the voltage applied to the gate.

6. An apparatus as claimed in claim 5, wherein said second diode is a Zener diode.

7. An apparatus as claimed in claim 4, or 5, wherein said non-linear component switching means further comprises a speed up diode and a resistor placed across the resistor to assist in charging the capacitor.

8. An apparatus as claimed in any one of claims 1, 2 or 3, wherein said output is in human or computer readable form.

9. An apparatus as claimed in any one of claims 1, 2 or 3, wherein said output includes a voltage reading of each of the individual batteries.

10. A method for detecting the condition of the individual cells of a bank of connected battery cells using a single common sensing wire connected through respective non-linear component switching means consisting of a series connection of a diode and a resistor to respective reference terminals located between adjacent batteries and at the end of the battery assembly, which method comprises:

injecting into the common sensing wire a voltage or current of magnitude, polarity and duration sufficient to alter the common state of the respective switching means;

detecting an instantaneous rapid change of impedance at points of transition of the state of the individual switches;

determining the voltage and/or current of the common sensing wire at the points of rapid change of impedance; and providing output indicating the condition of at least a deteriorating one of said individual batteries based on the voltage and/or current determined at the points of rapid change of impedance.

11. The method as claimed in claim 10, wherein the voltage or current injected into the common sensing wire includes a small AC ripple at a frequency greater than the frequency of the serial transition of said switches and the change in impedance, for example the point of opening of said switches, being monitored by synchronous detection of the non-injected parameter with double frequency to detect even harmonics of injected frequency.

12. The method as claimed in claim 10 wherein the detection of instantaneous change in impedance of the common sensing wire is accomplished by including the impedance in the resonant circuit of an oscillator and detecting the change in the free-running oscillation frequency of the circuit attributable to changes in the impedance.

13. The method as claimed in claim 10, wherein the instantaneous rapid change in impedance is detected by monitoring the changes in voltage and current in the common sensing wire during the period over which the respective switches are opened, plotting the change in voltage relative to change current for that period and comparing the plot against a reference plot.

14. In combination:

a pair of first and second terminals;

a battery assembly connected between said terminals comprising a plurality of serially arranged batteries having a pair of plus and minus battery terminals;

a plurality of intermediate terminals each interconnecting a plus terminal of one said battery module to the negative terminal of an adjacent said battery module;

a common electrical lead;

charging pulse generating means for generating a DC charge pulse from approximately zero to a voltage exceeding a voltage of said serially arranged plurality of battery modules, said charge voltage being connected between said first terminal and said common electrical lead and wherein said battery voltages at said second terminal with respect to said first terminal and said pulse voltage at said common lead with respect to said first terminal are of like polarity;

a plurality of the switching means, each connected between said common electrical lead and a discrete battery terminal for effecting a closed circuit during said charge pulse and some time after removal of the said charge pulse whereby said switching means are all closed during said charge pulse but open discretely and separately as a function of time;

a voltage sensing means of the said common electrical lead and indicating means responsive to said voltage sensing means.

15. A combination as in claim 14, wherein said switching means comprises:

time and voltage responsive switching means comprising of not more than one active semiconductor device in conjunction with passive elements between said common electrical lead and said terminal for providing a closing responsive to a potential between said common electrical lead and said intermediate terminal and open in response to the last said potential and the time constant.

16. A combination as set forth in claim 14, wherein said switching means is a field effect transistor and diode, the drain and source leads of which are connected in series with said diode between said SOURCE lead and one of said terminals, and the resistor connected between GATE and the last said terminal.

17. A combination as set forth in claim 16, wherein said resistor and the total capacitance between GATE and SOURCE the said field effect transistor form the said time constant.

* * * * *